(12) United States Patent
Kim et al.

(10) Patent No.: US 7,153,786 B2
(45) Date of Patent: Dec. 26, 2006

(54) METHOD OF FABRICATING LANTHANUM OXIDE LAYER AND METHOD OF FABRICATING MOSFET AND CAPACITOR USING THE SAME

(75) Inventors: Jong-Pyo Kim, Seongnam-si (KR); Jung-Hyun Lee, Suwon-si (KR); Bum-Seok Seo, Seoul (KR); Jung-Hyoung Lee, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 53 days.

(21) Appl. No.: 11/034,512

(22) Filed: Jan. 12, 2005

(65) Prior Publication Data

US 2005/0156256 A1 Jul. 21, 2005

(30) Foreign Application Priority Data

Jan. 13, 2004 (KR) ............... 10-2004-0002453

(51) Int. Cl.
*H01L 21/31* (2006.01)
*H01L 21/469* (2006.01)

(52) U.S. Cl. ............... 438/785; 257/E21.274
(58) Field of Classification Search ............... 438/785
See application file for complete search history.

(56) References Cited

U.S. PATENT DOCUMENTS

| | | | |
|---|---|---|---|
| 5,916,359 A | 6/1999 | Baum et al. ............ 106/287.18 |
| 6,110,529 A | 8/2000 | Gardiner et al. ............ 427/250 |
| 6,203,613 B1 | 3/2001 | Gates et al. ............ 117/104 |
| 2004/0043149 A1* | 3/2004 | Gordon et al. ............ 427/255.31 |
| 2006/0141155 A1* | 6/2006 | Gordon et al. ............ 427/255.19 |

FOREIGN PATENT DOCUMENTS

| | | |
|---|---|---|
| JP | 2002-060944 | 2/2002 |
| KR | 2002-0064126 | 8/2002 |

* cited by examiner

*Primary Examiner*—Alexander Ghyka
(74) *Attorney, Agent, or Firm*—Mills & Onello LLP

(57) ABSTRACT

Methods of fabricating a lanthanum oxide layer, and methods of fabricating a MOSFET and/or a capacitor especially adapted for semiconductor applications using such a lanthanum oxide layer are disclosed. The methods include a preliminary step of disposing a semiconductor substrate into a chamber. Tris(bis(trimethylsilyl)amino)Lanthanum as a lanthanum precursor is then injected into the chamber such that the lanthanum precursor is chemisorbed on the semiconductor substrate. Then, after carrying out a first purge of the chamber, at least one oxidizer is injected into the chamber such that the oxidizer is chemisorbed with the lanthanum precursor on the semiconductor substrate. Then, the chamber is purged a second time. The described steps of injecting the lanthanum precursor into the chamber, first-purging the chamber, injecting an oxidizer into the chamber, and second-purging the chamber may be sequentially and repeatedly performed to form a lanthanum oxide layer of a desired thickness having enhanced semiconductor characteristics.

29 Claims, 12 Drawing Sheets

METHOD OF FABRICATING LANTHANUM OXIDE LAYER AND METHOD OF FABRICATING MOSFET AND CAPACITOR USING THE SAME

CROSS-REFERENCE TO RELATED APPLICATION

This application claims the benefit of Korean Patent Application No. 2004-0002453, filed Jan. 13, 2004, the disclosure of which is hereby incorporated herein by reference in its entirety.

BACKGROUND

1. Technical Field

The present invention relates to methods of fabricating a dielectric layer and methods of fabricating a semiconductor device using the same, and more particularly, to methods of fabricating a lanthanum oxide layer, and methods of fabricating a MOSFET and a capacitor using the same.

2. Discussion of the Related Art

In a semiconductor memory device, a dielectric layer is used for various applications, and is generally used for a capacitor dielectric layer or a gate dielectric layer of a MOSFET. In order to operate a semiconductor device in a normal way, the gate dielectric layer or a capacitor dielectric layer should maintain an appropriate level of capacitance C. A capacitance C of a dielectric layer can be calculated by the formula $C=\epsilon*A/d$ (where C is the capacitance, $\epsilon$ is the dielectric constant, A is the area of a dielectric layer, and d is the thickness of a dielectric layer). That is, a capacitance of a dielectric layer is directly proportional to a dielectric constant and an area of a dielectric layer, and inversely proportional to a thickness thereof. A consequence of increasing the integration of a semiconductor memory device is that an area of a unit cell of the semiconductor memory device is reduced, and thus, an area of the gate dielectric layer or an area of the capacitor dielectric layer is also reduced. As a result, the capacitance of this element is also reduced. Therefore, various methods have been employed to compensate for a reduction of the capacitance due to a decrease of an area of the gate dielectric layer or of an area of the capacitor dielectric layer. Such methods may include a reduction of a thickness of the dielectric layer or use of a higher-k dielectric layer. However, the approach of reducing a thickness of the dielectric layer may lead to an undesirable increase in leakage current as the dielectric layer thickness is reduced. Therefore, it is generally necessary to employ a high-k dielectric layer in order to maintain an appropriate capacitance without an increase of a leakage current.

High-k dielectric layers such as an aluminum oxide layer ($Al_2O_3$) having a dielectric constant of about 9, a hafnium oxide layer ($HfO_2$) having a dielectric constant of about 20, or a zirconium oxide layer ($ZrO_2$) having a dielectric constant of about 25 can be used for the gate dielectric layer or for the capacitor dielectric layer Also, the high-k dielectric layers may include a tantalum oxide layer ($Ta_2O_5$) having a dielectric constant of about 20 to 60, and a titanium oxide layer ($TiO_2$) having a dielectric constant of about 40. Further, it is also known to create a dielectric layer having an ultra high dielectric constant, for example using a BST layer having a dielectric constant of about 200 to 300, a PZT layer having a dielectric constant of about 2000 to 3000, or the like. However, even though a new dielectric layer may have a desirably high dielectric constant, such a dielectric layer may not be suitable for use in a semiconductor device. Therefore, whether or not to use one of the new dielectric layers having an ultrahigh dielectric constant property involves many considerations such as an adaptability with existing fabrication processes of a typical semiconductor device, a reliability, a productivity, or the like, which factors will be considered in greater detail below.

Some of the problems which may be caused when applying the high-k dielectric layers to a gate dielectric layer are as follows. First, use of a BST layer, a titanium oxide layer, a tantalum oxide layer, and the like may result in an increase of a leakage current, a degradation of a carrier mobility, and/or similar interface problems because interface characteristics can deteriorate due to a high reactivity of the high-k layers with a silicon substrate. On the other hand, in the case of using an aluminum oxide layer, the aluminum oxide layer has a relatively excellent thermal stability, but its use as a dielectric layer is limited due to its relatively low dielectric constant. Further, aluminum oxide has a disadvantage in that it creates a difficulty in controlling a threshold voltage due to a negative fixed charge. Furthermore, the use of a hafnium oxide layer or a zirconium oxide layer is also limited because such materials may be crystallized during an annealing step of subsequent semiconductor fabrication processes, thereby increasing a leakage current.

In addition to the above-described problems, efforts to apply the high-k and ultra high-k dielectric layers to the capacitor dielectric layer may cause further problems as follows. Even though the BST layer and the PZT layer have ultra high dielectric constants, such layers are difficult to form with a uniform composition on a lower electrode structure having a high aspect ratio. The use of a high-k tantalum oxide layer is also limited because of the tendency to cause a high leakage current when used with a lower electrode consisting of a polysilicon layer due to a low conduction band offset at the polysilicon layer interface. Further, the use of a zirconium oxide layer or a hafnium oxide layer may cause a rapid increase in a leakage current during a subsequent annealing process step because these materials have relatively low crystallization temperatures. An aluminum oxide layer has the advantages of a relatively high conduction band offset at a polysilicon interface as well as a high crystallization temperature and an excellent step coverage, but it has a limited ability to increase a capacitance of a capacitor due to having a relatively low dielectric constant.

A lanthanum oxide layer ($La_2O_3$) as a dielectric layer has the several advantages of having a relatively high dielectric constant of about 27, a relatively high conduction band offset of about 2.7 eV, and a high crystallization temperature of about 900° C. In spite of such desirable dielectric properties, research for applying a lanthanum oxide layer to a gate dielectric layer (such as gate dielectric 104 as seen in FIG. 6) or to a capacitor dielectric layer (such as capacitor dielectric layer 324 as seen in FIG. 13) has not been actively carried out, presumably due to an absence of an appropriate precursor. One method of forming a lanthanum oxide layer which uses a CVD technology and a metal organic material, which includes a β-diketonate group of $La(thd)_3$ (Lanthanum tris(2,2,6,6-tetramethyl-3,5-heptanedionate)) as precursor, is disclosed in U.S. Pat. No. 6,110,529 and U.S. Pat. No. 5,916,359, which patents are incorporated herein by reference. However, the compound $La(thd)_3$ which is employed as a lanthanum precursor in these patents may not be suitable for actual commercial applications because of productivity and/or economic performance, or other operational limitations due to such process requirements as a low vapor pressure, a high process temperature, a low growth rate, or the like in comparison with the processes employed for forming other types of dielectric layers.

These and other problems with and limitations of prior art dielectric materials and fabrication/layer-formation processes are addressed in whole or at least in part by the methods and techniques of this invention.

SUMMARY OF THE INVENTION

Accordingly, the present invention is generally directed to methods of fabricating a lanthanum oxide dielectric layer for use in an improved semiconductor device, the methods having the characteristic of an improved layer formation productivity by using an appropriate precursor.

A more specific object of the present invention is to provide a method of fabricating a MOSFET of a semiconductor memory device that includes a method of fabricating a lanthanum oxide dielectric layer in accordance with this invention.

Still another object of the present invention is to provide a method of fabricating a capacitor of a semiconductor memory device that includes a method of fabricating a lanthanum oxide dielectric layer in accordance with this invention.

Exemplary embodiments of the present invention provide new and improved methods of fabricating a lanthanum oxide layer for use as a dielectric in a semiconductor device. The methods include a preliminary step of disposing a suitable semiconductor substrate into a chamber. Next, a lanthanum precursor in accordance with this invention is injected into the chamber under such conditions that the lanthanum precursor is chemisorbed on an exposed surface of the semiconductor substrate. A preferred lanthanum precursor in an embodiment of the present invention is tris(bis(trimethylsilyl)amino)Lanthanum. Then, after carrying out a first purging of the chamber, at least one oxidizer is injected into the chamber, under such conditions that the oxidizer is chemisorbed with the lanthanum precursor on the surface of semiconductor substrate. The chamber is then purged a second time.

The process steps of injecting a lanthanum precursor into the chamber, first-purging the chamber, injecting an oxidizer into the chamber, and second-purging the chamber may be sequentially and repeatedly performed to form a lanthanum oxide layer having a desired or predetermined thickness.

According to another aspect of the present invention, the present invention also provides a method of fabricating a MOSFET using a method of fabricating a lanthanum oxide layer according to the process steps summarized above or by other techniques. The method of fabricating a MOSFET in accordance with this invention embodiment includes the step of forming an isolation layer defining an active region in a semiconductor substrate. A gate dielectric layer including a lanthanum oxide layer fabricated in accordance with this invention is formed on the active region of the MOSFET. In a preferred embodiment of this aspect of the invention, the lanthanum oxide layer is formed, for example by an ALD technique, using tris(bis(trimethylsilyl)amino) Lanthanum as a lanthanum precursor. Then, a gate electrode crossing the active region is formed on the gate dielectric layer.

According to still another aspect of the present invention, the present invention provides a method of fabricating a capacitor using a method of fabricating a lanthanum oxide layer according to the process steps summarized above or by other techniques. The method of fabricating a capacitor in accordance with this invention embodiment includes the step of forming a lower electrode. A capacitor dielectric layer including a lanthanum oxide layer fabricated in accordance with this invention is formed on the lower electrode, and the lanthanum oxide layer is formed, for example by an ALD technique, using tris(bis(trimethylsilyl)amino)Lanthanum as a lanthanum precursor. Then, an upper electrode is formed on the capacitor dielectric layer.

Further, in accordance with another embodiment of the present invention, a reaction barrier layer may be formed on the lower electrode before forming the dielectric layer including the lanthanum oxide layer as described above. Further, in still another invention embodiment, an annealing process may be performed on the capacitor dielectric layer before forming the upper electrode.

These and other objects, advantages and embodiments of this invention will be apparent from the following detailed description.

BRIEF DESCRIPTION OF THE DRAWINGS

The above and other features and advantages of the present invention will become more apparent to those of ordinary skill in the art from a description of preferred embodiments thereof with reference to the attached drawings in which.

DETAILED DESCRIPTION OF THE INVENTION

Figure 1:
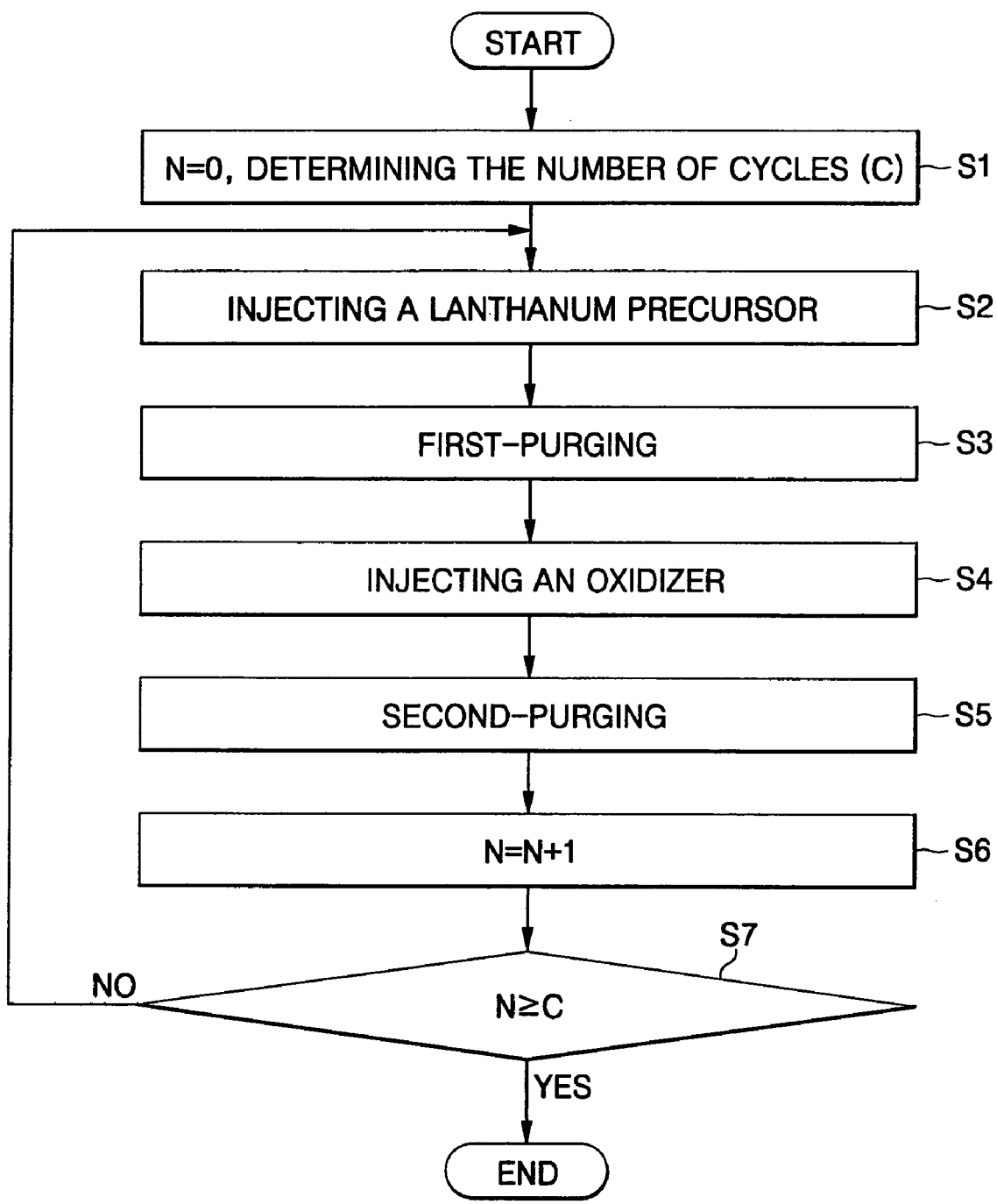
FIG. 1 is a process flow chart illustrating the sequential steps in a method of fabricating a lanthanum oxide layer according to an embodiment of the present invention.

The present invention will now be described more fully hereinafter with reference to the accompanying drawings, in which preferred embodiments of the invention are shown. It will be understood, however, that this invention may be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a process flow chart illustrating the sequential steps in a method of fabricating a lanthanum oxide layer according to an embodiment of the present invention.

An atomic layer deposition (ALD) method is a preferred technique used in the method of fabricating a lanthanum oxide layer according to an embodiment of the present invention. The ALD method is a method involving sequential process steps of forming a thin film on a surface of a substrate by a unit of atomic layer thickness based on a first step of chemisorption of a reaction material, followed by a surface reaction step and a step of desorption of by-products. This method allows a very precise thickness control of a very thin film using a low-temperature process, since a material is deposited as a very thin film by a unit of an atomic layer. Further, the method has many additional advantages including showing an excellent step coverage on a pattern having a very high aspect ratio, introducing very few impurities, and substantially avoiding the formation of pin holes inside layers, or the like.

Referring to FIG. 1, a suitable semiconductor substrate is introduced into a reaction chamber. The number N, which represents the number of times that one cycle is performed, is initialized as zero (0), and the desired number of cycles C is input (step S1). Then, a suitable lanthanum precursor is supplied into the chamber (step S2). In the present invention, the preferred lanthanum precursor is (tris(bis(trimethylsilyl)amino)Lanthanum;La(N(SiMe$_3$)$_2$)$_3$), in which Me is a methyl group, and wherein the compound can be represented by Formula 1 below:

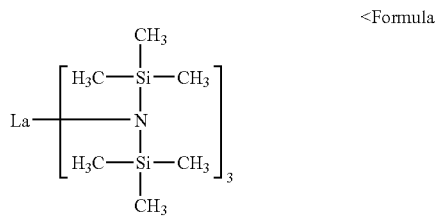

<Formula 1>

The compound La(N(SiMe$_3$)$_2$)$_3$ has a melting point of about 160° C., and has a relatively high vapor pressure of about 1 Torr at a temperature of about 165° C. The La(N(SiMe$_3$)$_2$)$_3$ supplied to the chamber in step S2 reacts with and/or is deposited on the surface of the semiconductor substrate through the process of chemisorption. Once a mono layer of La(N(SiMe$_3$)$_2$)$_3$ is formed on the semiconductor substrate, an excess of La(N(SiMe$_3$)$_2$)$_3$ does not further react with the substrate due to a self-limiting reaction, but extra precursor may be physically and loosely adsorbed to the mono layer formed along the semiconductor substrate surface. Such extra precursor is removed in a subsequent purging step (step S3) as described below.

The ALD method used in conjunction with this invention may be of either a bubbler type or an injector type in accordance with different approaches to injecting the precursor into the chamber in step S2. As is widely known, the bubbler type approach injects precursor into the chamber after supplying the precursor into a canister of a bubbler, and while heating the bubbler to a predetermined temperature and carrying the precursor into the chamber with a suitable (preferably substantially inert) carrier gas. If, however, the precursor has a relatively low vapor pressure and a relatively high melting point, the precursor may be better suited to the injector type approach which injects precursor into the chamber by first dissolving the precursor into an appropriate solvent, and then supplying the resulting solution to a vaporizer and carrying the vaporized precursor into the chamber with a suitable carrier gas. Further, in a case where the precursor has a relatively low melting point and thus, maintains the liquid state at a low temperature, a liquid state of the precursor may be supplied to the vaporizer without use of a solvent, and the vaporized precursor is then carried into the chamber with a suitable carrier gas.

Figure 2:
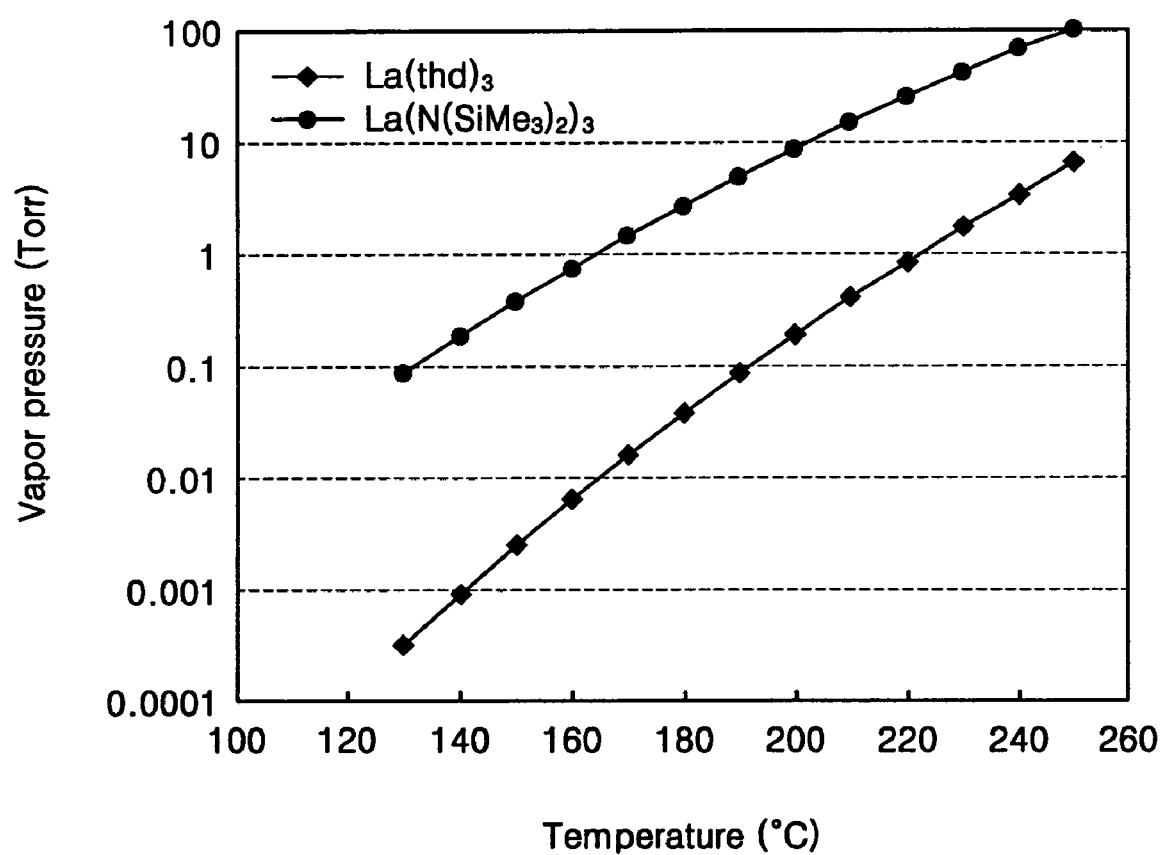
FIG. 2 is a graph comparing the vapor pressures over a temperature range of a conventional lanthanum precursor with those of a lanthanum precursor according to an embodiment of the present invention.

FIG. 2 is a graph comparing the vapor pressures over a temperature range of 100° C. to 260° C. of a conventional lanthanum precursor, namely La(thd)$_3$ with those of a lanthanum precursor, namely La(N(SiMe$_3$)$_2$)$_3$, according to an embodiment of the present invention.

Referring to FIG. 2, the lanthanum precursor, La(N(SiMe$_3$)$_2$)$_3$ according to the embodiment of the present invention demonstrates a significantly higher vapor pressure than the conventional lanthanum precursor La(thd)$_3$ throughout the relevant temperature range. That is, while the lanthanum precursor La(N(SiMe$_3$)$_2$)$_3$ according to embodiments of the present invention has a relatively high vapor pressure of about 1 Torr at a temperature of about 165° C., the typical lanthanum precursor La(thd)$_3$ needs to be heated to a temperature of about 225° C. in order to achieve about 1 Torr of vapor pressure. As a result, in the case of using the bubbler type ALD method, the lanthanum precursor according to this invention can be efficiently supplied into the reaction chamber at a relatively low temperature according to one of the advantages of the present invention. Further, while the lanthanum precursor La(N(SiMe$_3$)$_2$)$_3$ according to embodiments of the present invention has a melting point of about 160° C., the conventional lanthanum precursor La(thd)$_3$ has a melting point of about 260° C. Therefore, in the case of using the injector type ALD method, the lanthanum precursor La(N(SiMe$_3$)$_2$)$_3$ of the present invention can be more easily supplied into the vaporizer in the liquid state without use of a solvent. Alternatively, the lanthanum precursor La(N(SiMe$_3$)$_2$)$_3$ in embodiments of the present invention can be dissolved in a solvent and supplied to the vaporizer as earlier described. In this case, the solvent may advantageously be selected from the group consisting of tetra hydrofuran(THF), tetra hydropyrimi dine(THP) and tetra fluorophenyl(TFP). As described above, the lanthanum precursor La(N(SiMe$_3$)$_2$)$_3$ of the present invention can be effectively injected into the chamber more easily and by using more different methods than with the conventional lanthanum precursor La(thd)$_3$.

Still referring to FIG. 1, after forming a first mono layer of the La(N(SiMe$_3$)$_2$)$_3$ on the semiconductor substrate, the chamber is subjected to a first purge step (step S3). The purge process is performed by injecting a non-reactive gas such as an inert gas such as argon (Ar) or the like, or nitrogen (N$_2$) into and through the chamber for a sufficient period of time for effective purging. As a result, the excess of the La(N(SiMe$_3$)$_2$)$_3$, which has been physically and/or loosely adsorbed on the mono layer of the La(N(SiMe$_3$)$_2$)$_3$ is substantially completely removed from the chamber.

Then, an oxidizer is injected into the chamber (step S4). In a preferred embodiment of the present invention, the oxidizer may be selected from the group consisting of H$_2$O, H$_2$O$_2$, O$_3$, O$_2$, and N$_2$O. Preferably, at the time of or prior to injection into the reaction chamber the oxidizer may be activated by a plasma treatment or by ultraviolet ray irradiation. The oxidizer injected into the chamber is chemisorbed along the surface with the La(N(SiMe$_3$)$_2$)$_3$ which has been previously chemisorbed on the semiconductor substrate. Once the oxidizer has saturated the mono layer of the $La(N(SiMe_3)_2)_3$, it does not further react because this is a self-limiting reaction.

Further, in one embodiment of this aspect of the present invention, the injection of the oxidizer into the chamber (step S4) may be performed by a method of continuously injecting two different kinds of oxidizers at the same time or in sequence. As described above, $H_2O$ or $H_2O_2$ as the oxidizer can be injected into the chamber during step S4, but if only one oxidizer including an —OH_group (e.g., $H_2O$) is used, the —OH group may remain inside the layer, thereby degrading the characteristics of the deposited lanthanum oxide layer. It has been found, however, that the degradation of the characteristics of the deposited lanthanum oxide layer can be prevented by injecting a first oxidizer including an —OH group into the chamber while also continuously injecting $O_2$ or $O_3$ into the chamber. For example, a method wherein step S4 consists of injecting two kinds of oxidizers may be performed as follows. First, $H_2O$ as a first oxidizer is injected into the chamber. Then, the chamber is purged using an inert gas such as Ar or the like, or nitrogen. Then, $O_3$ as a second oxidizer is injected into the chamber.

Still referring to FIG. 1, after the step S4 of injecting the oxidizer into the chamber, the chamber is subjected to a second purge step (step S5). The second purge step is performed by injecting a non-reactive gas such as an inert gas such as Ar or the like, or nitrogen ($N_2$) into and through the chamber for a sufficient period of time for effective purging. As a result, the excess of the oxidizer injected into the chamber is substantially completely removed from the chamber.

After one complete cycle of the deposition process consisting of steps S2 through S5, a single atomic layer of the lanthanum oxide layer is formed on the semiconductor substrate, and the number N is increased by 1 (step S6). Then, the increased number N, and the number of desired cycles C, which has been initially input, are compared (step S7). If the increased number N at step S7 is smaller than the number of the initially-input desired cycles C, the steps (S2, S3, S4, S5, S6 and S7) are sequentially and repeatedly performed until the increased number N at step S7 is equal to the number of the desired cycles C, thereby fabricating a lanthanum oxide layer with a desired thickness on the semiconductor substrate.

In order to compare the performance characteristics of a lanthanum oxide layer fabricated using a conventional material $La(thd)_3$ as a precursor with those of a lanthanum oxide layer fabricated using $La(N(SiMe_3)_2)_3$ according to an embodiment of the present invention as a precursor, two lanthanum oxide layers are respectively fabricated in accordance with the conditions of Table 1 below.

TABLE 1

| Precursor | $La(thd)_3$ | $La(N(SiMe_3)_2)_3$ |
| --- | --- | --- |
| deposition method | ALD | ALD |
| substrate temperature (° C.) | 400 | 175 |
| chamber pressure (Torr) | 0.2 | 0.2 |
| oxidizer | $O_3$ | $H_2O/Ar/O_3$ |
| purge gas/flow rate (sccm) | Ar/300 | Ar/300 |

As shown in Table 1, a low-temperature fabrication process is possible according to the embodiment of the present invention for the reasons described previously, whereas a higher temperature process must be used for the conventional precursor. This fact means that the $La(N(SiMe_3)_2)_3$ used in the embodiment of the present invention has a high reactivity with the oxidizer even at a lower process temperature, and it can be said that the $La(N(SiMe_3)_2)_3$ is a more appropriate lanthanum precursor for such semiconductor fabrication application than the $La(thd)_3$ precursor.

Figure 3:
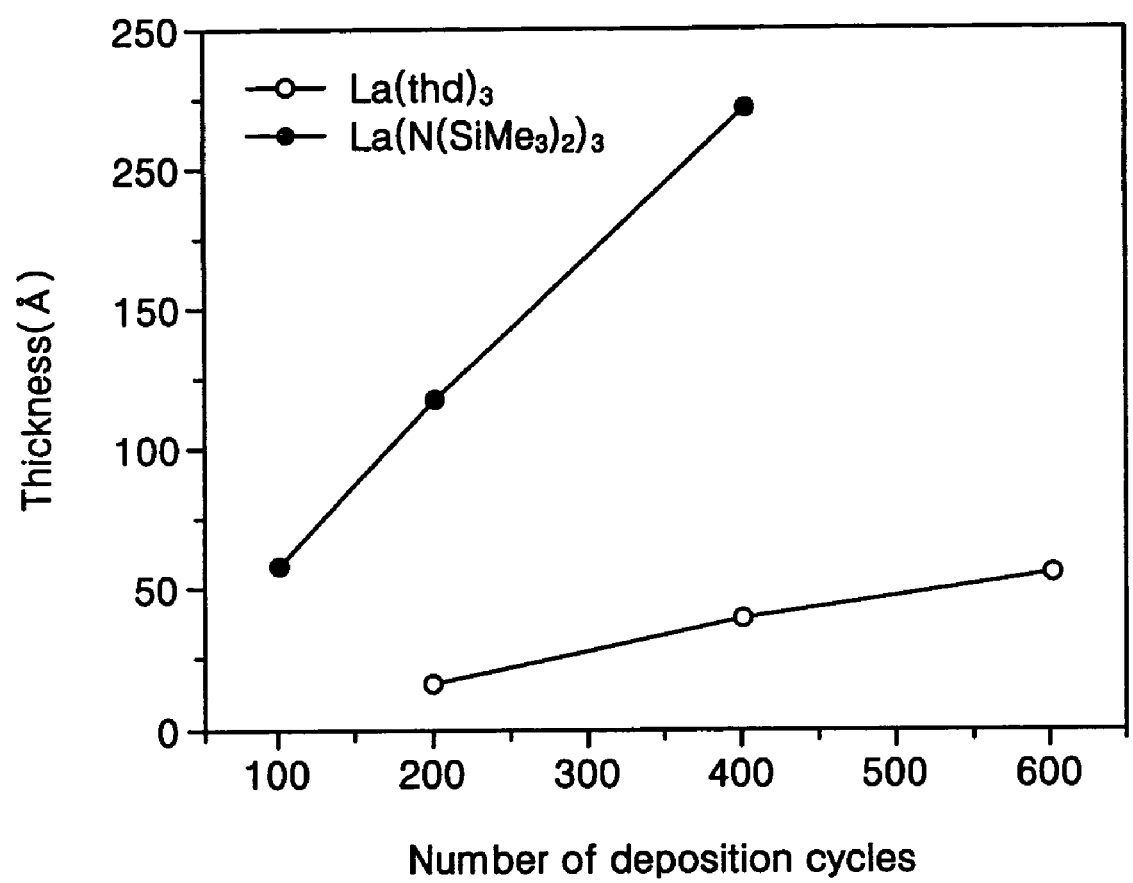
FIG. 3 is a graph comparing the deposition thicknesses of lanthanum oxide layers, which are respectively fabricated using a conventional lanthanum precursor and using a lanthanum precursor according to an embodiment of the present invention, over a range of deposition cycles.

FIG. 3 is a graph comparing the respective deposition thicknesses of the different lanthanum oxide layers, which are respectively deposited by the conditions of Table 1, in accordance with the number of of deposition cycles.

Referring to FIG. 3, this graph illustrates that the average deposition rate in the case of using $La(N(SiMe_3)_2)_3$ as a lanthanum precursor is about 0.6 Å/number of deposition cycles, while the average deposition rate in the case of using $La(thd)_3$ as a lanthanum precursor is only about 0.1 Å/number of deposition cycles, which shows a dramatic difference in the two deposition rates of as much as six times. These results mean that a dramatic improvement in fabrication productivity is realized when a lanthanum oxide semiconductor layer is fabricated using the $La(N(SiMe_3)_2)_3$ according to embodiments of the present invention as the lanthanum precursor.

Figure 4:
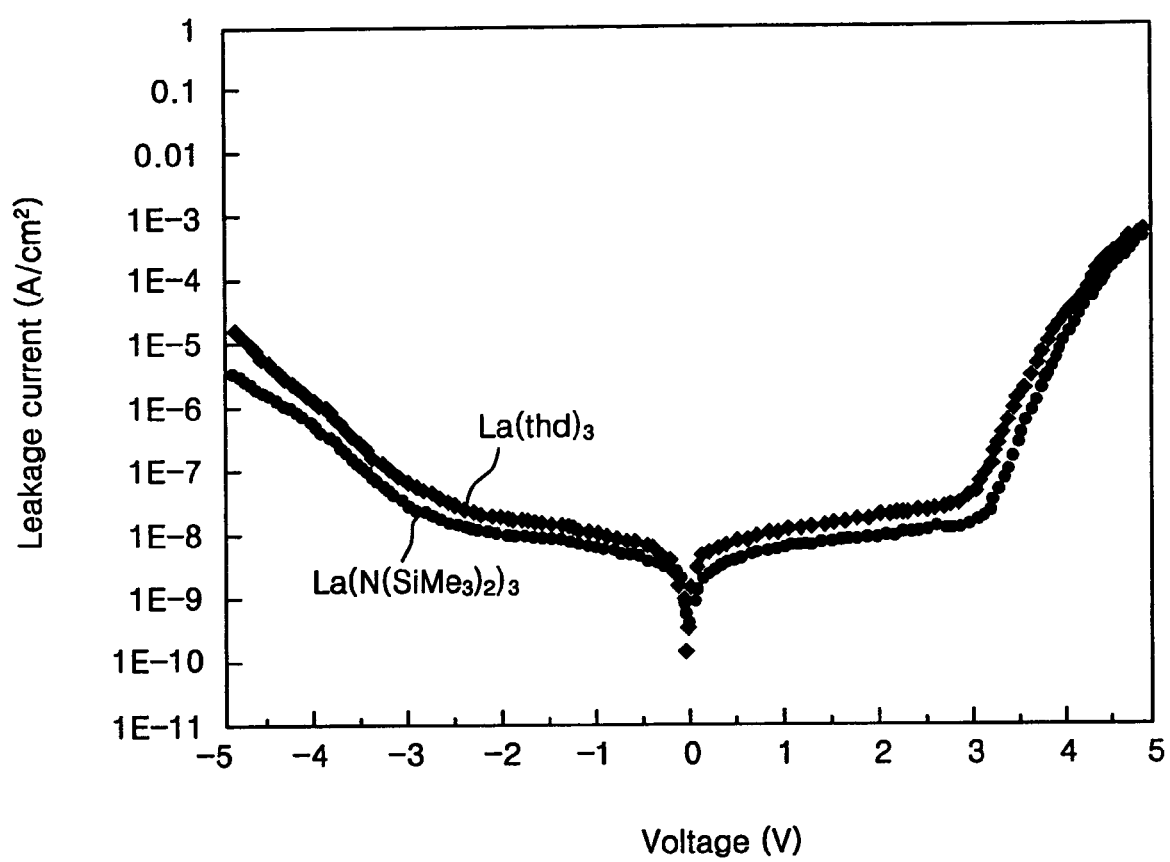
FIG. 4 is a graph comparing the electrical characteristics, specifically the level of leakage current, of lanthanum oxide layers, which are respectively fabricated using a conventional lanthanum precursor and using a lanthanum precursor according to an embodiment of the present invention over a range of voltages.

FIG. 4 is a graph comparing the respective electrical characteristics, specifically the level of leakage current, of different lanthanum oxide layers, which are respectively deposited in accordance with the process conditions of Table 1.

Referring to FIG. 4, this graph illustrates that the leakage current characteristics of the lanthanum oxide layer fabricated using $La(N(SiMe_3)_2)_3$ as a lanthanum precursor is significantly improved relative to those of the lanthanum oxide layer fabricated using $La(thd)_3$ as a lanthanum precursor.

Figure 5:
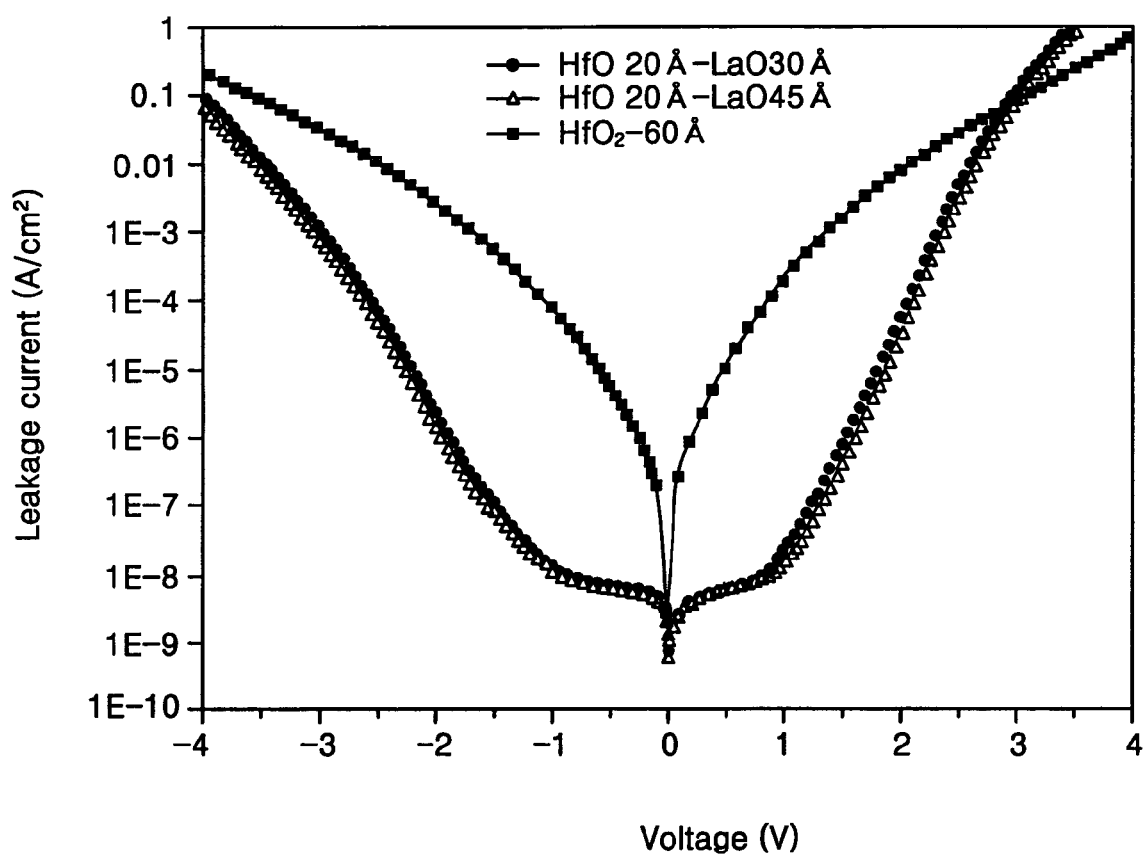
FIG. 5 is a graph comparing the electrical characteristics, specifically the level of leakage current, of a single layer of a hafnium oxide layer, with those of two different stacked layers of hafnium oxide layer/lanthanum oxide layer.

FIG. 5 is a graph comparing the respective electrical characteristics, specifically the level of leakage current, of a single layer of a hafnium oxide layer with those of two different stacked layers of hafnium oxide layer/lanthanum oxide layer.

Referring to FIG. 5, the single layer of the hafnium oxide layer was formed with a thickness of 60 Å by an ALD method using TEMAH (tetra ethyl methyl amino hafnium) as the hafnium precursor and $O_3$ as the oxidizer. One stacked layer of hafnium oxide layer/lanthanum oxide layer was formed with a thickness of 20 Å/30 Å and a second with a thickness of 20 Å/45 Å respectively. The lanthanum oxide layer of each of the stacked layers was fabricated using $La(N(SiMe_3)_2)_3$ as a lanthanum precursor by the conditions of Table 1. Then, the single layer of the hafnium oxide layer and the two stacked layers were respectively annealed at a temperature of 750° C. for about 1 minute, and the respective leakage currents thereof were measured. The results, as shown in FIG. 5, demonstrate that each of the stacked layers of hafnium oxide layer/lanthanum oxide layer shows better thermal stability than the single layer of the hafnium oxide layer. More particularly, these results are best understood as follows: in the case of the single layer of the hafnium oxide layer, a relatively high level of crystallization is generated during the annealing process resulting in a significant increase in the level of leakage current of the final semiconductor element. However, in the case of the stacked layers of hafnium oxide layer/lanthanum oxide layer, the lanthanum oxide layer, because it has a crystallization temperature of about 900° C., functions as a leakage current barrier layer, thereby contributing to the excellent thermal stability and low leakage levels of the stacked layers.

Figure 6:
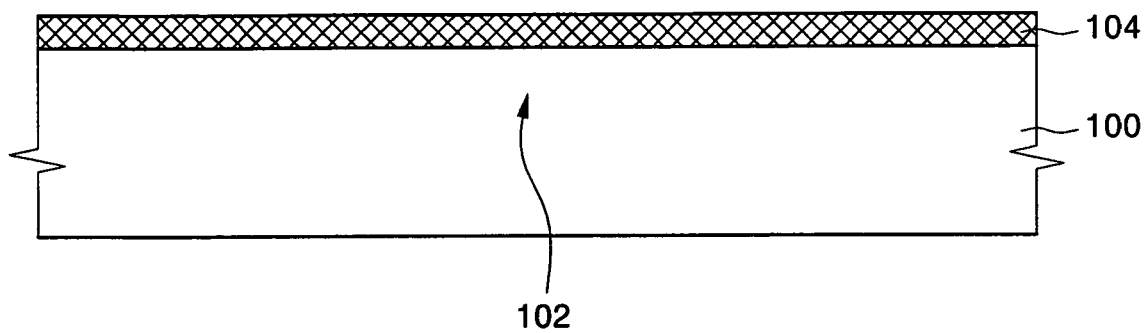
FIGS. 6 through 8 are schematic cross-sectional views illustrating the steps in a method of fabricating a MOSFET according to an embodiment of the present invention.
Figure 7:
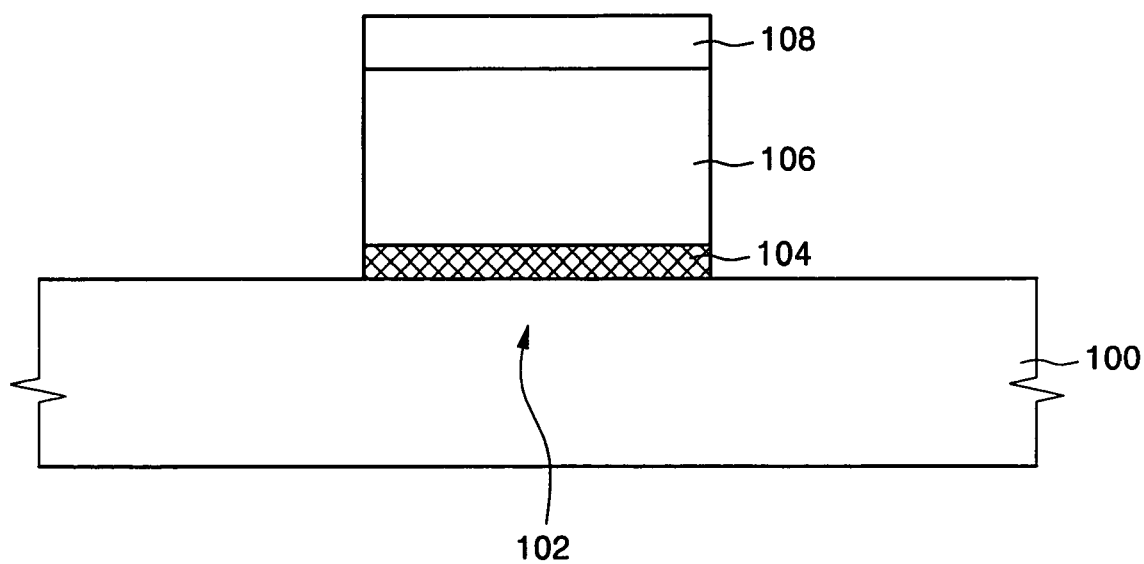
Figure 8:
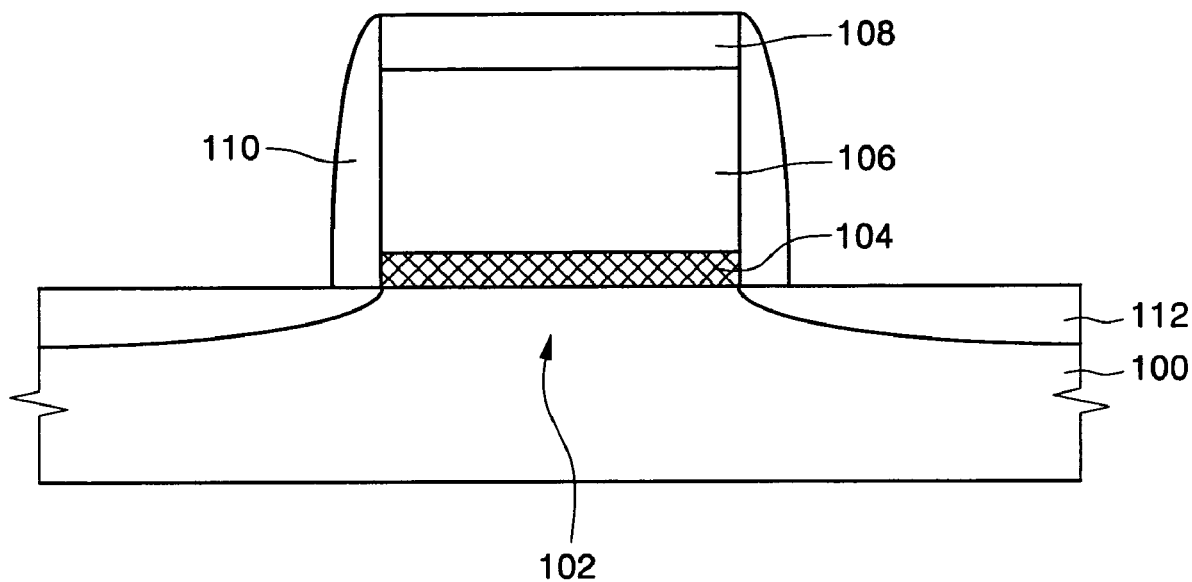

FIGS. 6 through 8 are schematic cross-sectional views illustrating the steps in a method of fabricating a MOSFET according to an embodiment of the present invention.

Referring to FIG. 6, an isolation layer (not shown) is formed to define an active region 102 of a suitable semiconductor substrate 100. The isolation layer used to define the active region 102 can be formed by, for example, an STI (shallow trench isolation) process. Then, a gate dielectric layer 104 is formed on the active region 102. The gate dielectric layer 104 according to embodiments of the present invention is formed of a dielectric layer that includes a lanthanum oxide layer. The gate dielectric layer 104 may consist essentially of a lanthanum oxide layer or of stacked layers consisting of a lanthanum oxide layer and another dielectric layer. The lanthanum oxide layer in accordance with this invention is fabricated by an ALD method using $La(N(SiMe_3)_2)_3$ as a lanthanum precursor as described in detail above in connection with FIG. 1. Embodiments of the present invention wherein the stacked layers of a lanthanum oxide layer and a dielectric layer are used include all variations in which one or more lanthanum oxide layers and one or more dielectric layers are sequentially stacked or alternately stacked. The dielectric layer in these embodiments of the present invention refers to a dielectric layer which is a different material than the lanthanum oxide layer. For example, the dielectric layer may consist essentially of one or more layers selected from the group consisting of a silicon oxide layer, a silicon nitride layer, a silicon oxynitride layer, a hafnium oxide layer, a zirconium oxide layer, a tantalum oxide layer, a titanium oxide layer, and stacked layers consisting of a combination thereof.

In the next step of the fabrication process, the gate dielectric layer 104, including the lanthanum oxide layer or layers, is annealed. The annealing process is performed to suppress a generation of a leakage current by making a layer structure of the gate dielectric layer 104 more dense, and also to improve a capacitance of the gate dielectric layer 104. The annealing may be performed in the presence of an inert gas such as Ar, or alternatively under vacuum, at a temperature of about 300 to 900° C. and at a pressure preferably less than about $10^{-3}$ Torr.

Referring to FIG. 7, a gate electrode 106 crossing the active region 102 is formed on the gate dielectric layer 104 following the annealing step. In forming gate electrode 106, a conductive layer is first formed on the gate dielectric layer 104. Such conductive layer may be formed of, for example, a polysilicon layer. Then, by patterning the conductive layer, the gate electrode 106 is formed across the active region. Preferably, a capping layer 108 may be further formed on the gate electrode 106. The capping layer 108 may be formed, for example, of a silicon nitride (SiN) layer or any other suitable capping material.

Referring to FIG. 8, after forming the gate electrode 106 and the capping layer 108, gate spacers 110 covering sidewalls of the gate electrode 106 (as well as along the sidewalls of lower adjacent layer 104 and upper adjacent layer 108) are formed through a known process, and source/drain regions 112 are formed in the portion of the active region 102 adjacent to the gate electrode 106. More specifically source/drain regions 112 may be formed, for example, by implanting selected impurity ions into the active region 102 using the gate electrode 106 and the capping layer 108 as ion implantation masks, thereby forming an LDD (lightly doped drain) region in the active region 102. Then, a conformal spacer insulating layer, for example a silicon nitride layer, is formed on the whole surface of the resultant structure including over the LDD region, and the silicon nitride layer is anisotropically etched, thereby forming gate spacers 110 covering sidewalls of the gate electrode 106. Then, high concentration impurity ions are implanted into the active region using the gate electrode 106, the capping layer 108, and the gate spacer 110 as ion implantation masks, thereby forming LDD type source/drain regions 112 on the active region 102 and creating the structure illustrated in FIG. 8.

FIGS. 9 through 14 are schematic cross-sectional views illustrating the steps in a method of fabricating a capacitor according to an embodiment of the present invention.

Figure 9:
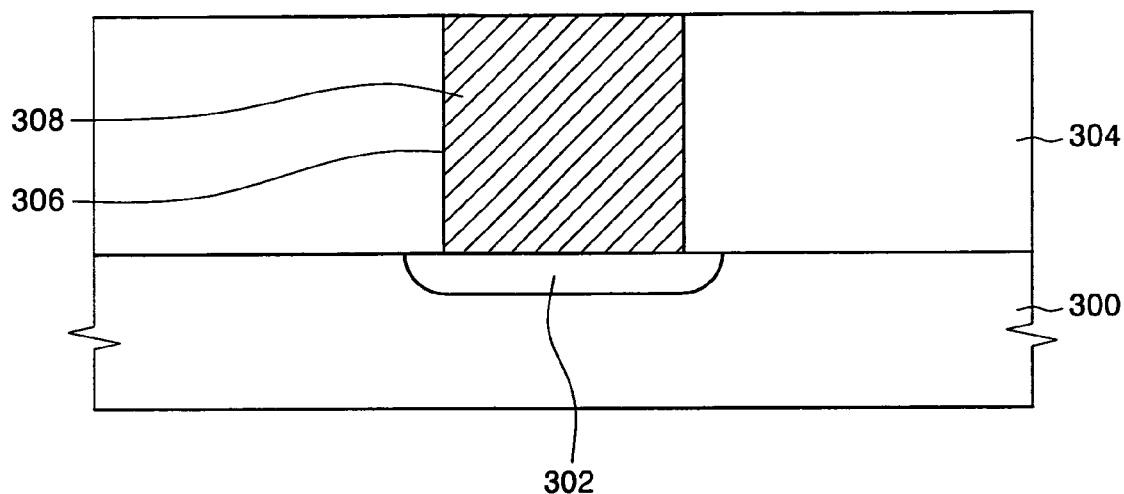
FIGS. 9 through 14 are schematic cross-sectional views illustrating the steps in a method of fabricating a capacitor according to an embodiment of the present invention.

Referring to FIG. 9, an interlayer insulating layer 304 is formed on a suitable semiconductor substrate 300. The interlayer insulating layer 304 may be formed of, for example, a silicon oxide layer, a silicon oxynitride layer, a phosphor silicate glass (PSG) layer, a undoped silicate glass (USG) layer, a borophosphor silicate glass (BPSG) layer, or the like. An isolation layer (not shown) defining an active region is formed on the semiconductor substrate 300 having the interlayer insulating layer 304 formed thereon by known techniques, such as an STI process. A semiconductor element, for example a field effect transistor, is formed on the active region defined by the isolation layer. A description and illustration of certain other typical elements formed on the semiconductor substrate 300 is omitted in the drawing, but a source region 302 is schematically shown in FIG. 9. After forming the interlayer insulating layer 304, a photolithography process and an anisotropic process are performed, thereby forming a contact hole 306 for exposing the source region 302 through the interlayer insulating layer 304. Then, after forming a conductive layer, such as polysilicon or the like, on the whole surface of the semiconductor substrate 300 to fill the contact hole 306, the conductive layer is planarized to expose the interlayer insulating layer 304 by a chemical mechanical polishing (CMP) process, thereby forming a buried contact plug 308 filling the contact hole 306.

Figure 10:
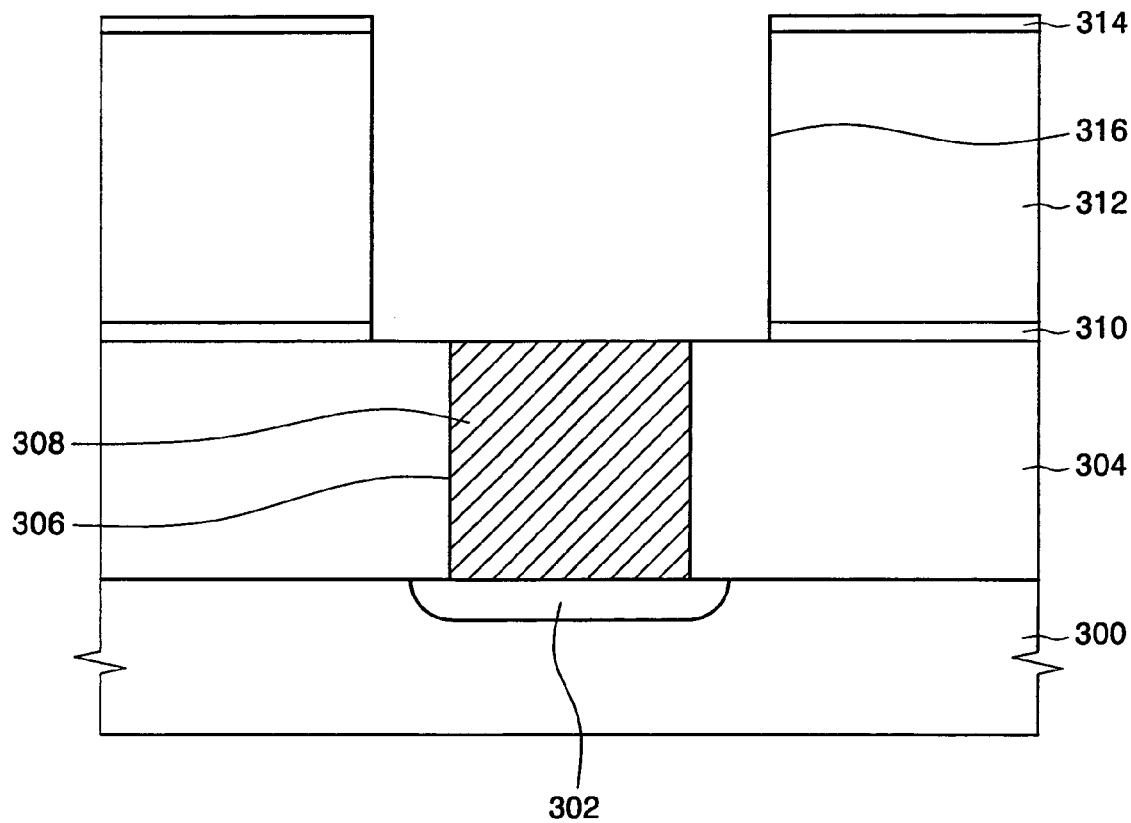

Referring now to FIG. 10, an etch stop layer 310, a mold material layer 312, and a polishing stop layer 314 are sequentially formed on the semiconductor substrate having the buried contact plug 308 (as shown in FIG. 9). The mold material layer 312 may be formed of, for example, a silicon oxide layer, a silicon oxynitride layer, a PSG layer, a USG layer, a BPSG layer, or the like. The etch stop layer 310 and the polishing stop layer 314 may be formed of, for example, a silicon nitride layer. Then, a photolithography process and an anisotropic etching process are performed, thereby forming a lower electrode trench 316 in the mold material layer 312 so as to expose at least an upper surface of the buried contact plug 308.

Figure 11:
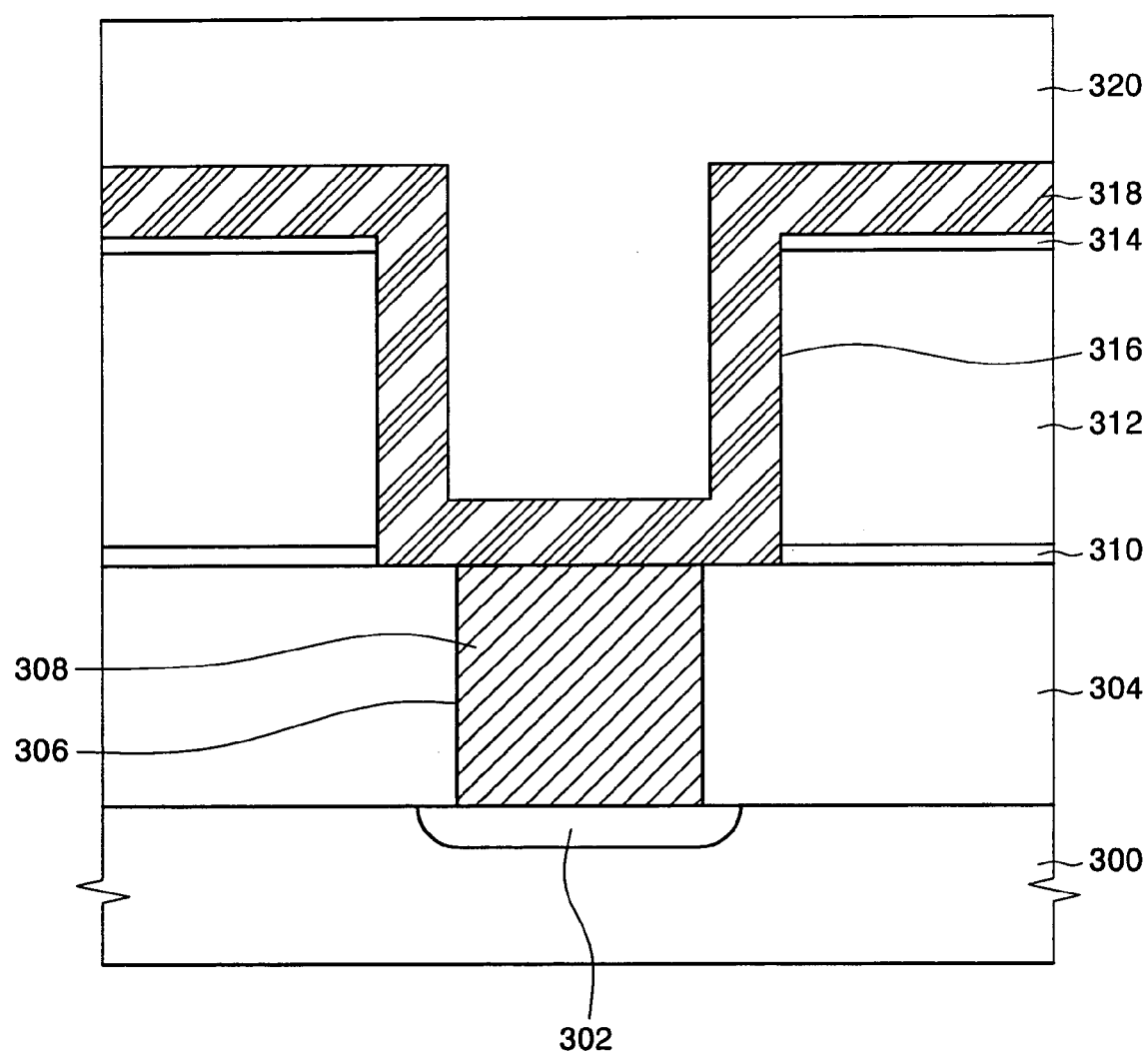

Referring next to FIG. 11, a conformal lower conductive layer 318 is formed on the inner surface of the lower electrode trench 316 and on the polishing stop layer 314. The lower conductive layer 318 may be at least one conductive layer selected from the group consisting of a metal layer, a metal nitride layer, a metal oxide layer, a metal oxynitride layer, an impurity-doped polysilicon layer, and stacked layer combinations thereof. For example, lower conductive layer 318 may be a metal layer selected from a ruthenium (Ru) layer, an iridium (Ir) layer, a tungsten (W) layer, a platinum (Pt) layer, or a tantalum (Ta) layer. Alternatively, lower conductive layer 318 may be a metal nitride layer selected from a titanium nitride (TiN) layer, a tantalum nitride (TaN) layer, or a tungsten nitride (WN) layer. Alternatively, lower conductive layer 318 may be a metal oxide layer selected from an iridium oxide ($IrO_2$) layer or a ruthenium oxide ($RuO_2$) layer. Alternatively, lower conductive layer 318 may be a metal oxynitride layer selected from a tantalum oxynitride (TaON) layer or a titanium oxynitride (TiON) layer. After forming layer 318, a sacrificial layer 320 is formed to completely fill the remaining portion of the lower electrode trench 316, which previously was partially filled by the lower conductive layer 318. The sacrificial layer 320 may be formed of a silicon oxide layer, a silicon oxynitride layer, a PSG layer, a USG layer, a BPSG layer, or the like.

Figure 12:
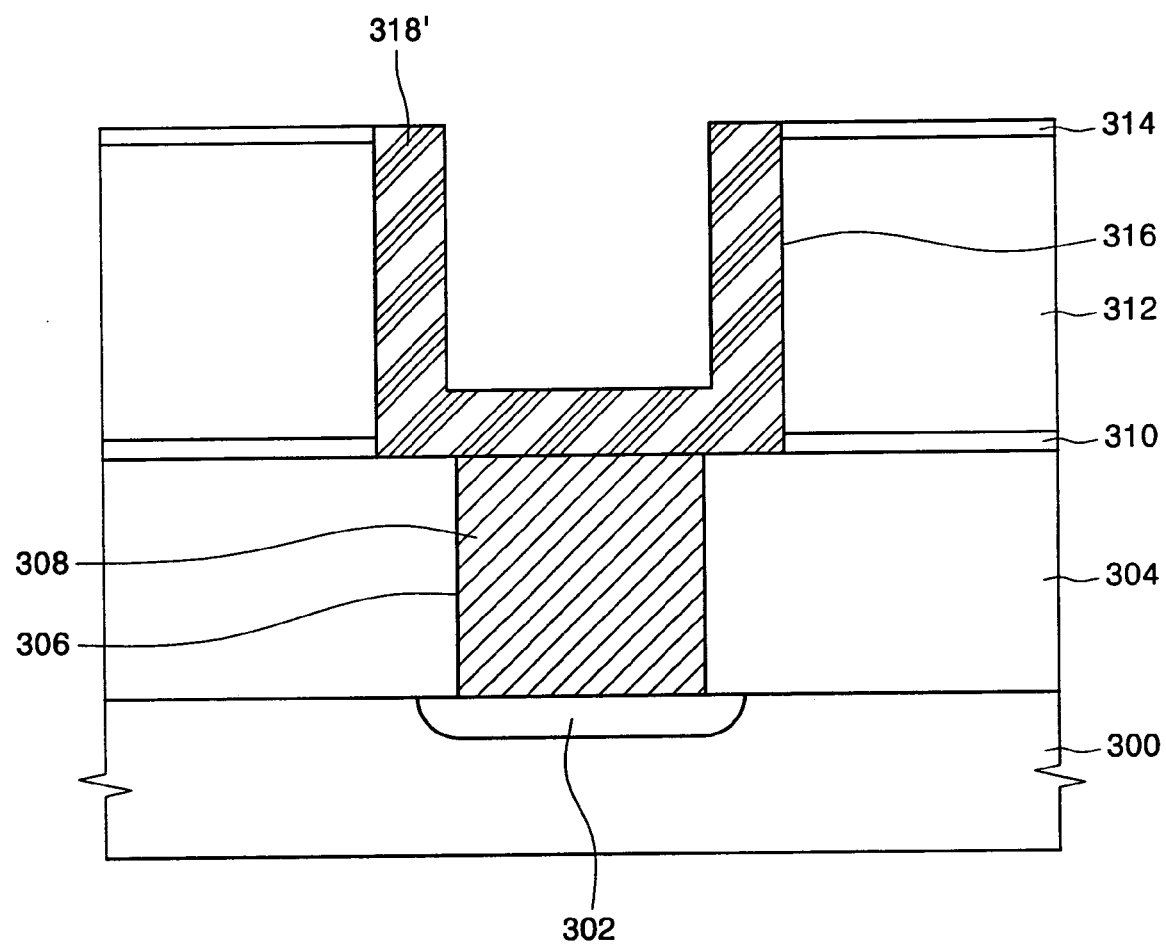

Referring now to FIG. 12, the sacrificial layer 320 and the lower conductive layer 318 of FIG. 11 are sequentially planarized until the polishing stop layer 314 is exposed. The planarization process may be performed through, for example, a CMP process. Then, the portion of the sacrificial layer 320 which remains inside the lower electrode trench 316 is removed. The portion of sacrificial layer 320 which remains inside the lower electrode trench 316 is preferably removed by a wet etching process. For example, a HF (hydro fluoric acid) solution or a BOE (buffer oxide etchant) may be used as a suitable etchant for layer 320. As a result of removing the sacrificial layer 320, a lower electrode 318' is formed (or exposed) along the inside of lower electrode trench 316. In this embodiment of the present invention, the lower electrode 318' is formed to have a hollowed-out concave structure as described above. However, in another embodiment of the present invention, the lower electrode 318' may be formed as a filled, three-dimensional structure such as a cylinder, a stack, or the like.

Figure 13:
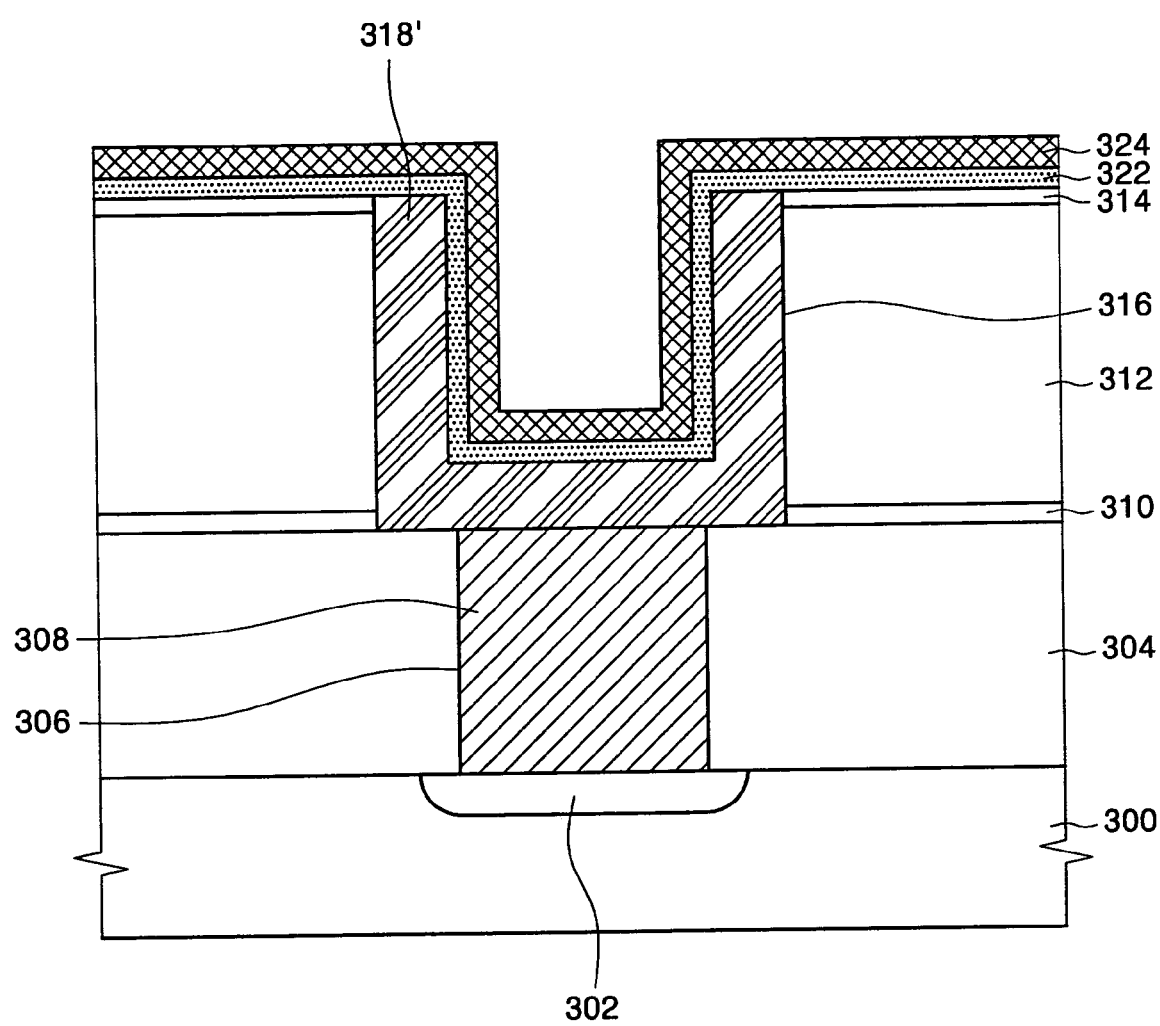

Referring next to FIG. 13, after forming the lower electrode 318', a reaction barrier layer 322 is further formed on at least the exposed surfaces of lower electrode 318'. The reaction barrier layer 322 is formed to prevent a reaction or a diffusion of the lower electrode 318' or of a capacitor dielectric layer 324 to be formed as part of the device by a subsequent process. The reaction barrier layer 322 may be formed by treating the lower electrode 318' by a rapid thermal nitridation (RTN) process or a rapid thermal oxidation (RTO) process. For example, if the lower electrode 318' is composed of polysilicon, a silicon oxide layer or a silicon nitride layer may be formed on an upper surface of the polysilicon lower electrode 318' through the RTN or the RTO treatment. Alternatively, the reaction barrier layer 322 may be formed of a silicon nitride layer, a silicon oxide layer, or a silicon oxynitride layer using a CVD method.

After forming the reaction barrier layer 322, a capacitor dielectric layer 324 is formed on the whole surface of the resultant structure including on the reaction barrier layer 322. The capacitor dielectric layer 324 is preferably formed by an ALD method. In embodiments of the present invention, the capacitor dielectric layer 324 is formed of a dielectric layer that includes a lanthanum oxide layer. The capacitor dielectric layer 324 may consist essentially of a lanthanum oxide layer or of stacked layers consisting of a lanthanum oxide layer and another dielectric layer. The lanthanum oxide layer in accordance with this invention is formed by an ALD method using $La(N(SiMe_3)_2)_3$ as a lanthanum precursor. Embodiments of the present invention wherein stacked layers of a lanthanum oxide layer and a dielectric layer are used include all variations in which one or more lanthanum oxide layers and one or more dielectric layers are sequentially stacked or alternately stacked. The dielectric layer in these embodiments of the present invention refers to a dielectric layer which is a different material than the lanthanum oxide layer. For example, the dielectric layer may consist essentially of one or more layers selected from the group consisting of a silicon oxide layer, a silicon nitride layer, a silicon oxynitride layer, a hafnium oxide layer, a zirconium oxide layer, a tantalum oxide layer, a titanium oxide layer, and stacked layers consisting of a combination thereof.

For example, the capacitor dielectric layer 324 may be formed of a stacked layer by sequentially stacking one lanthanum oxide layer and one hafnium oxide layer, each of which has a thickness of one or multiple atomic units, or may be formed as a stacked layer of a nano laminate structure in which multiple alternating lanthanum oxide layers and hafnium oxide layers are alternately stacked.

Figure 14:
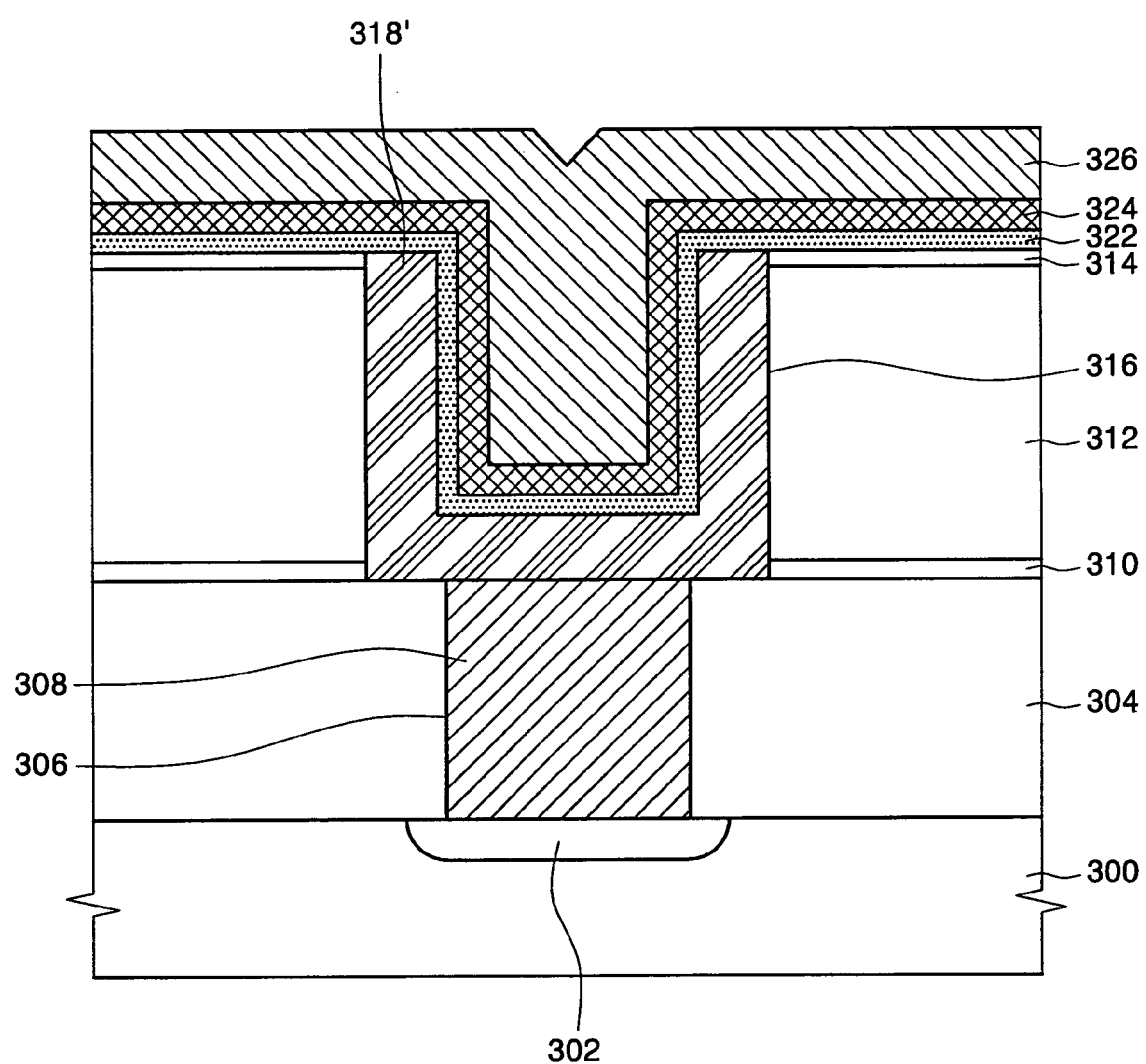

Referring finally to FIG. 14, after forming the capacitor dielectric layer 324 including the lanthanum oxide layer as shown in FIG. 13, the capacitor dielectric layer 324 may be annealed. As a result, a capacitance of the capacitor dielectric layer 324 can be further improved, and the density of capacitor dielectric layer 324 is increased, thereby helping to suppress generation of a leakage current. The annealing process may be performed in the presence of an inert gas such as Ar, or alternatively under vacuum at a temperature of about 300 to 900° C. and at a pressure preferably less than about $10^{-3}$ Torr. Then, an upper electrode 326, is formed on the capacitor dielectric layer 324. The upper electrode 326 may be at least one conductive layer selected from the group consisting of a metal layer, a metal nitride layer, a metal oxide layer, a metal oxynitride layer, an impurity-doped polysilicon layer, and stacked layer combinations thereof. For example, upper conductive layer 326 may be a metal layer selected from a ruthenium (Ru) layer, an iridium (Ir) layer, a tungsten (W) layer, a platinum (Pt) layer, or a tantalum (Ta) layer. Alternatively, upper conductive layer 326 may be a metal nitride layer selected from a titanium nitride (TiN) layer, a tantalum nitride (TaN) layer, or a tungsten nitride (WN) layer. Alternatively, upper conductive layer 326 may be a metal oxide layer selected from an iridium oxide ($IrO_2$) layer or a ruthenium oxide ($RuO_2$) layer. Alternatively, upper conductive layer 326 may be a metal oxynitride layer selected from a tantalum oxynitride (TaON) layer or a titanium oxynitride (TiON) layer.

As described above, according to the present invention, a lanthanum oxide layer having improved properties and characteristics for semiconductor applications can be efficiently and effectively fabricated using $La(N(SiMe_3)_2)_3$ as a lanthanum precursor, under more advantageous process conditions than similar prior art processes, and resulting in improved productivity and a better performing semiconductor device. Using the lanthanum oxide layer fabricated in accordance with the present invention, an improved performance MOSFET and an improved performance capacitor having improved semiconductor characteristics can be fabricated.

While the present invention has been described with reference to certain particular embodiments, it is understood that the disclosure has been made for purposes of illustrating the invention by way of examples and not to limit the scope of the invention. One skilled in the art would be able to amend, change, or modify the present invention in many apparent ways without departing from the scope and spirit of the present invention disclosure.

Having described the invention, what is claimed is:

What is claimed is:

1. A method of fabricating a lanthanum oxide layer in a semiconductor device comprising the sequential steps of:
   a) disposing a semiconductor substrate into a chamber;
   b) injecting a lanthanum precursor into the chamber such that a layer of the lanthanum precursor is chemisorbed on the semiconductor substrate, wherein the lanthanum precursor consists essentially of tris(bis(trimethylsilyl)amino)Lanthanum;
   c) conducting a first purge of the chamber;
   d) injecting at least one oxidizer into the chamber such that the oxidizer is chemisorbed with the lanthanum precursor on the semiconductor substrate;

e) conducting a second purge of the chamber; and, f) repeating steps (b) through (e) until a lanthanum oxide layer of a desired multi-atomic layer thickness is obtained.

2. The method according to claim 1, wherein the step of injecting the lanthanum precursor into the chamber is performed using a bubbler type technique or an injector type technique.

3. The method according to claim 2, wherein an injector type technique is used and the solution for dissolving the lanthanum precursor is at least one member selected from the group consisting of THF, THP and TFP.

4. The method according to claim 1, wherein the first purge step and the second purge step are performed by passing an inert gas or a nitrogen gas into and through the chamber.

5. The method according to claim 1, wherein the oxidizer is at least one member selected from the group consisting of $H_2O$, $H_2O_2$, $O_3$, $O_2$, and $N_2O$.

6. The method according to claim 5, wherein the oxidizer is activated through a plasma treatment or a ultraviolet ray irradiation treatment.

7. The method according to claim 1, wherein the step of injecting the at least one oxidizer into the chamber comprises the sequential steps of:

injecting a first oxidizer that includes an —OH group into the chamber;

purging the chamber using an inert gas or a nitrogen gas; and injecting a second oxidizer that includes $O_3$ or $O_2$ into the chamber.

8. The method according to claim 7, wherein the first oxidizer is $H_2O$ and the second oxidizer is $O_3$.

9. A method of fabricating a MOSFET for semiconductor applications comprising the sequential steps of:

forming an isolation layer to define an active region in a semiconductor substrate;

forming a gate dielectric layer that includes a lanthanum oxide layer on the active region, wherein the lanthanum oxide layer is formed by an ALD technique using tris(bis(trimethylsilyl)amino)Lanthanum as a lanthanum precursor; and forming a gate electrode crossing the active region on the gate dielectric layer.

10. The method according to claim 9, wherein the gate dielectric layer consists of a single layer of a lanthanum oxide layer.

11. The method according to claim 9, wherein the gate dielectric layer consists of stacked layers including at least a lanthanum oxide layer and a dielectric layer.

12. The method according to claim 11, wherein the dielectric layer is a layer selected from the group consisting of a silicon oxide layer, a silicon nitride layer, a silicon oxynitride layer, a hafnium oxide layer, a zirconium oxide layer, a tantalum oxide layer, a titanium oxide layer, and a stacked layer consisting of combinations thereof.

13. The method according to claim 9, further comprising a step of performing an annealing process on the gate dielectric layer before the step of forming the gate electrode.

14. The method according to claim 13, wherein the annealing process is performed under vacuum or in the presence of an inert gas.

15. The method according to claim 13, wherein the annealing process is performed at a temperature of about 300 to 900° C. and at a pressure equal to or less than $10^{-3}$ Torr.

16. The method according to claim 9, further comprising a step of forming source/drain regions in the active region adjacent to the gate electrode after the step of forming the gate electrode.

17. A method of fabricating a capacitor for semiconductor applications comprising the sequential steps of:

forming a lower electrode;

forming a capacitor dielectric layer that includes a lanthanum oxide layer on the lower electrode, wherein the lanthanum oxide layer is formed by an ALD technique using tris(bis(trimethylsilyl)amino)Lanthanum as a lanthanum precursor; and forming an upper electrode on the capacitor dielectric layer.

18. The method according to claim 17, wherein the lower electrode is formed as a structure selected from the group consisting of a stack structure, a cylinder structure, and a concave structure.

19. The method according to claim 17, wherein the lower electrode consists of a conductive layer selected from the group consisting of a metal layer, a metal nitride layer, a metal oxide layer, a metal oxynitride layer, an impurity-doped polysilicon layer, and a stacked layer consisting of combinations thereof.

20. The method according to claim 17, wherein the capacitor dielectric layer consists of a single layer of a lanthanum oxide layer.

21. The method according to claim 17, wherein the capacitor dielectric layer consists of stacked layers including at least a lanthanum oxide layer and a dielectric layer.

22. The method according to claim 21, wherein the dielectric layer is a layer selected from the group consisting of a silicon oxide layer, a silicon nitride layer, a silicon oxynitride layer, a hafnium oxide layer, a zirconium oxide layer, a tantalum oxide layer, a titanium oxide layer, and a stacked layer consisting of combinations thereof.

23. The method according to claim 17, wherein the upper electrode consists of a conductive layer selected from the group consisting of a metal layer, a metal nitride layer, a metal oxide layer, a metal oxynitride layer, an impurity-doped polysilicon layer, and a stacked layer consisting of combinations thereof.

24. The method according to claim 17, further comprising a step of forming a reaction barrier layer on the lower electrode before the step of forming the dielectric layer including a lanthanum oxide layer.

25. The method according to claim 24, wherein the reaction barrier layer is formed by treating the lower electrode by means of an RTN (rapid thermal nitridation) process or an RTO (rapid thermal oxidation) process.

26. The method according to claim 24, wherein the reaction barrier layer is formed of a silicon oxide layer, a silicon nitride layer, or a silicon oxynitride layer using a CVD method.

27. The method according to claim 17, further comprising a step of performing an annealing process on the capacitor dielectric layer before the step of forming the upper electrode.

28. The method according to claim 27, wherein the annealing process is performed under vacuum or in the presence of an inert gas.

29. The method according to claim 27, wherein the annealing process is performed at a temperature of about 300 to 900° C. and at a pressure equal to or less than $10^{-3}$ Torr.

* * * * *